United States Patent
Wang

(10) Patent No.: US 10,984,995 B2
(45) Date of Patent: *Apr. 20, 2021

(54) HYBRID SOLAR GENERATOR

(71) Applicant: GE AVIATION SYSTEMS LLC, Grand Rapids, MI (US)

(72) Inventor: John Xiaozhong Wang, Grand Rapids, MI (US)

(73) Assignee: GE Aviation Systems LLC, Grand Rapids, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 16/808,977

(22) Filed: Mar. 4, 2020

(65) Prior Publication Data

US 2020/0381227 A1 Dec. 3, 2020

Related U.S. Application Data

(63) Continuation of application No. 15/178,023, filed on Jun. 9, 2016, now Pat. No. 10,679,834.

(51) Int. Cl.
*H01J 1/34* (2006.01)
*H01J 40/06* (2006.01)
(Continued)

(52) U.S. Cl.
CPC .......... *H01J 40/06* (2013.01); *F02C 6/08* (2013.01); *F02C 6/18* (2013.01); *H01G 9/209* (2013.01);
(Continued)

(58) Field of Classification Search
CPC .... F02C 6/18; H01G 9/209; H01J 1/34; H01J 40/06; H01J 40/16; H01J 45/00; H01J 9/12; H01L 35/30; H01L 51/447

See application file for complete search history.

(56) References Cited

U.S. PATENT DOCUMENTS

| 4,257,823 A | 3/1981 | Bevilacqua et al. |
| 4,463,214 A * | 7/1984 | Lowther ............. H01L 35/30 |
| | | 136/208 |

(Continued)

FOREIGN PATENT DOCUMENTS

| CN | 102187425 A | 9/2011 |
| CN | 105517899 A | 4/2016 |

(Continued)

OTHER PUBLICATIONS

Su, S., et al., "Material optimum choices and parametric design strategies of a photon-enhanced solar cell hybrid system," Solar Energy Materials and Solar Cells, vol. 128, pp. 112-118 (Sep. 2014) (Year: 2014).*

(Continued)

*Primary Examiner* — Matthew T Largi
(74) *Attorney, Agent, or Firm* — McGarry Bair PC

(57) ABSTRACT

A solar generator can include a photon-enhanced thermionic emission generator with a cathode to receive solar radiation. The photon-enhanced thermionic emission generator can include an anode that in conjunction with the cathode generates a first current and waste heat from the solar radiation. A thermoelectric generator can be thermally coupled to the anode and can convert the waste heat from the anode into a second current. A circuit can connect to the photon-enhanced thermionic emission generator and to the thermoelectric generator and can combine the first and the second currents into an output current.

19 Claims, 6 Drawing Sheets

(51) Int. Cl.
*F02C 6/18* (2006.01)
*H01J 45/00* (2006.01)
*F02C 6/08* (2006.01)
*H01G 9/20* (2006.01)
*H01J 9/12* (2006.01)
*H01J 40/16* (2006.01)
*H01L 51/44* (2006.01)
*B64D 41/00* (2006.01)
*H01L 35/30* (2006.01)

(52) U.S. Cl.
CPC ..................... *H01J 1/34* (2013.01); *H01J 9/12* (2013.01); *H01J 40/16* (2013.01); *H01J 45/00* (2013.01); *H01L 51/447* (2013.01); *B64D 41/00* (2013.01); *H01L 35/30* (2013.01)

(56) References Cited

U.S. PATENT DOCUMENTS

| | | |
|---|---|---|
| 6,313,391 B1 | 11/2001 | Abbott |
| 6,489,704 B1* | 12/2002 | Kucherov ............... H02N 3/00 310/306 |
| 6,854,273 B1 | 2/2005 | Lasley et al. |
| 7,776,295 B2 | 8/2010 | Konigorski |
| 8,283,553 B1 | 10/2012 | Yap et al. |
| 8,853,531 B2 | 10/2014 | Schwede et al. |
| 2004/0045594 A1* | 3/2004 | Hightower ............... F02C 6/18 136/205 |
| 2008/0283110 A1* | 11/2008 | Jin ............... H01L 35/30 136/206 |
| 2009/0159110 A1* | 6/2009 | Kwok ............... F02C 6/14 136/205 |
| 2011/0100430 A1 | 5/2011 | Zak, Jr. et al. |
| 2012/0111386 A1* | 5/2012 | Bell ............... H01L 35/00 136/205 |
| 2014/0000668 A1* | 1/2014 | Lessard ............... F01K 7/44 136/201 |
| 2015/0047684 A1* | 2/2015 | Mitchell ............... H01L 35/28 136/201 |
| 2017/0126150 A1* | 5/2017 | Wang ............... H01L 35/30 |

FOREIGN PATENT DOCUMENTS

| | | |
|---|---|---|
| JP | 2007-81097 A1 | 3/2007 |
| KR | 10 2010 0030778 A | 3/2010 |
| RU | 166 483 U1 | 11/2016 |
| WO | 2011149509 A2 | 12/2011 |

OTHER PUBLICATIONS

Su, S., et al., "Material optimum choices and parametric design strategies of a photon-enhanced solar cell hybrid system," Solar Energy Materials & Solar Cell, vol. 128, pp. 112-118 (Sep. 2014).

Nick Melosh, Photon Enhanced Thermionic Emission (PETE) for Solar Concentrator Systems, Stanford University—Global Climate & Energy Project, 3 pages, https://web.stanford.edu/group/gcep/cgi-bin/gcep-research/all/photon-enhanced-thermionic-emission-pete-for-solar-concentrator-systems/, Accessed Jun. 9, 2016.

Naito, H., et al., "Development of a Solar Receiver for a High-Efficiency Thermionic/Thermoelectric Conversion System," Solar Energy, vol. 58, No. 4-6, pp. 191-195 (Oct. 1996).

* cited by examiner

HYBRID SOLAR GENERATOR

CROSS REFERENCE TO RELATED APPLICATION(S)

This application claims priority to and benefit of U.S. patent application Ser. No. 15/178,023, filed Jun. 9, 2016, now U.S. Pat. No. 10,679,834, issued Jun. 9, 2020, which is incorporated herein in its entirety.

BACKGROUND OF THE INVENTION

The photon-enhanced thermionic emission (PETE) generator is a semiconductor-based device converting both the photonic and thermal energies of solar radiation to electricity at a higher conversion efficiency than conventional photovoltaic cells. Typically a vacuum gap is required between the cathode and the anode, and the PETE device operates most efficiently at temperatures in excess of 200 degrees Celsius, the reference temperature for aircraft engine bleed air. Unfortunately, the electrical conversion process produces waste heat which is often not utilized in certain applications, such as in an aircraft that depends on solar energy for its operation or propulsion. For example, there may be a lack of synergy between the PETE generator and other systems consuming or generating energy on an aircraft. Also, the operating temperature may be unregulated which can reduce the conversion efficiency of the PETE, depending on an amount of incident solar radiation and the ambient temperature. Additionally, the vacuum gap can be expensive to include in the fabrication process.

SUMMARY OF THE INVENTION

In one aspect, there is disclosed a solar generator including a photon-enhanced thermionic emission generator having a cathode configured to receive solar radiation and an anode that in conjunction with the cathode is configured to generate a first current and waste heat from solar radiation, a thermoelectric generator thermally coupled to the anode, the thermoelectric generator configured to convert a first portion of heat receivable from waste heat and supplemental heat from a supplemental heat source into a second current, an ambient sink thermally coupled with the thermoelectric generator and the supplemental heat source, the ambient sink configured to remove a second portion of the heat receivable from waste heat and the supplemental heat, and configured to deliver the second portion of the heat to the supplemental heat source to be mixed with the supplemental heat, a solar collector thermally connected to the thermoelectric generator, and wherein the supplemental heat is solar radiation collectable by the solar collector, and a circuit connected to the photon-enhanced thermionic emission generator and to the thermoelectric generator to combine the first and second currents into an output current.

In another aspect, there is disclosed a hybrid solar generator including a photon-enhanced thermionic emission generator having a cathode configured to receive solar radiation and an anode that in conjunction with the cathode is configured to generate a first current and waste heat from solar radiation, a thermoelectric generator thermally coupling the anode and in communication with a source of heated bleed air, the thermoelectric generator configured to convert a first portion of the heat receivable from the waste heat and the heated bleed air into a second current, an ambient sink thermally coupled with the thermoelectric generator and the heated bleed air, the ambient sink configured to remove a second portion of the heat receivable from waste heat and the heated bleed air, and configured to be reintroduced to the heated bleed air to be mixed with the heated bleed air, and a circuit connected to the photon-enhanced thermionic emission generator and to the thermoelectric generator to combine the first and second currents into an output current.

In yet another embodiment, there is disclosed a method of converting solar radiation to electricity including providing a photon-enhanced thermionic emission generator having a cathode to receive the solar radiation and an anode that in conjunction with the cathode generates a first current and waste heat from the solar radiation, exposing the cathode to the solar radiation, providing a supplemental heat source in the form of heated bleed air from a gas turbine engine, disposing a thermoelectric generator adjacent the anode to convert a first portion of heat received from the waste heat and a supplemental heat from the supplemental heat source into a second current, dissipating a second portion of heat received from the waste heat and the supplemental heat from the thermoelectric generator to a heat flow, and mixing the heat flow with the supplemental heat upstream of the thermoelectric generator, and combining the first current and the second current into an output current.

DETAILED DESCRIPTION

As may be appreciated, based on the disclosure, there exists a need in the art for higher conversion efficiencies in the electrical generators that convert solar radiation to electricity. Also, there exists a need in the art for a more efficient utilization of the heat available from solar radiation. Additionally, there exists a need in the art for an integration of solar generators with other power systems on an aircraft, such as other sources and sinks of heat.

Figure 1:
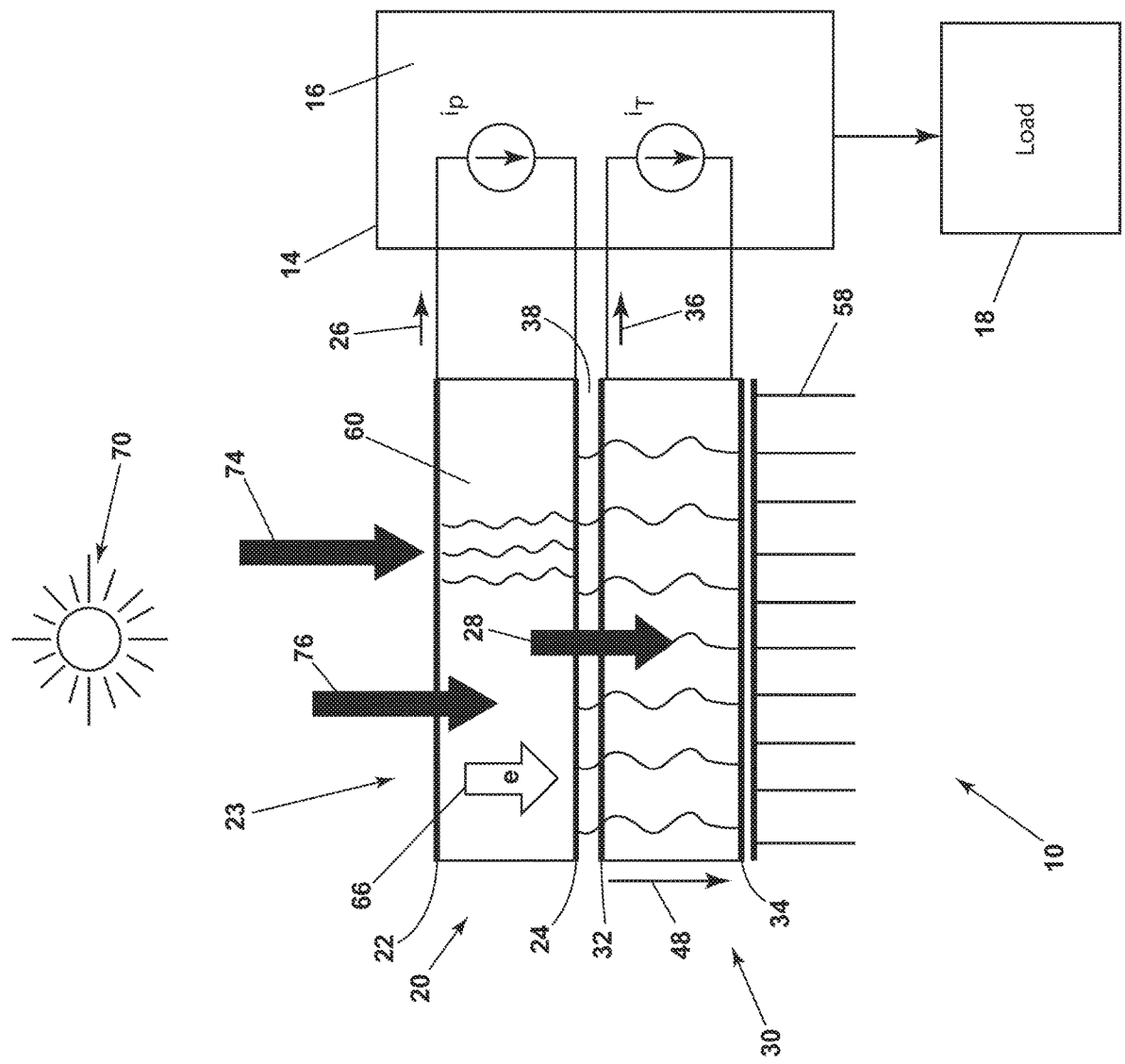
FIG. 1 illustrates a schematic of a photon-enhanced thermionic emission generator directing waste heat to a thermoelectric generator, in accordance with various aspects described herein.

Referring to FIG. 1, in one aspect of the present disclosure, a solar generator 10 can include a photon-enhanced thermionic emission (PETE) generator 20 having a cathode 22 to receive solar radiation 70 and an anode 24 that in conjunction with the cathode 22 generates a first current 26 (ip) and waste heat 28 from the solar radiation 70. A flow of electrons 66 can be stimulated by visible light 76 transferring photons (not shown) and infrared light 74 transferring heat 78 into the PETE generator 20. There can be a gap 60 between the cathode 22 and the anode 24, and the gap 60 can be a vacuum gap for enhancing the production of PETE current 26. A thermoelectric generator (TEG) 30 can be thermally coupled to the anode 24 to convert the waste heat 28 from the anode 24 into a second current 36 (iT). The thermoelectric generator 30 can include a hot plate 32 and a cold plate 34 jointly defining a thermal gradient 48 generating the second current 36. The hot plate 32 can thermally couple the waste heat 28 via thermal contact with the anode 24.

Continuing with FIG. 1, in various aspects of the present disclosure, an ambient sink 58 can be thermally coupled to cold plate 34 for establishing the thermal gradient 48 necessary to generate second current 36. The TEG 30 can be disposed adjacent the PETE generator 20 for assuring efficient heat transfer between the anode 24 and the hot plate 32. For example, anode 24 and hot plate 32 can both be planar surfaces configured for intimate thermal contact at a thermal junction 38. Alternatively, PETE generator 20 and TEG 30 can be next to each other yet not necessarily touching. For example, a vapor chamber can thermally couple PETE generator 20 and TEG 30. A circuit 14 can be connected to the PETE generator 20 and to the TEG 30 to combine the first 26 and second 36 currents into an output current 16, and the combined output current can supply electrical load 18. First 26 and second 36 currents can be summed to feed one or more electrical loads powered by the solar generator 10, or each current can support separate loads within the environment of the solar generator 10.

Thermal junction 38 may include an additional element (not shown) interposed between anode 24 and hot plate 32 to facilitate thermal coupling of anode 24 and hot plate 32 or to facilitate mounting or thermally coupling the thermal junction 38 to structures outside the TEG 30. For example, an aluminum oxide plate may be inserted at junction 38 for thermally conducting waste heat 28 while electrically insulating PETE generator 20 from TEG 30. Multiple solar generators 10 can be electrically combined to suit the needs of electrical load 18 and to take advantage of available solar radiation 70. Further implementations for adding heat or concentrating solar energy to feed the solar generator are disclosed below.

Referring still to FIG. 1, in various aspects of the present disclosure, the cathode 22 of PETE generator 20 can be a semiconductor for absorbing solar radiation 70 and exciting electrons 66 into a vacuum gap 60 when photons impinge on the cathode 22. The anode 24 can be made of metal. Various implementations for fabricating PETE generator 20 and TEG 30 are disclosed in more detail below.

Beneficially, unused heat (waste heat) 28 from PETE generator 20 can be used by TEG 30 to develop additional electrical energy and to optimize an anode temperature for higher PETE current 26. For example, a PETE generator 20 can operate at a conversion efficiency of approximately twice that of photovoltaic cells, and the waste heat 28 can further boost the combined PETE/TEG solar generator 10 conversion efficiency by several percentage points compared to a PETE alone. An additional advantage of the solar generator 10 is that the consumption of waste heat 28 by TEG 30 can optimize the anode temperature or minimize any reverse current so that the conversion efficiency of PETE generator 20 is increased.

Figure 2:
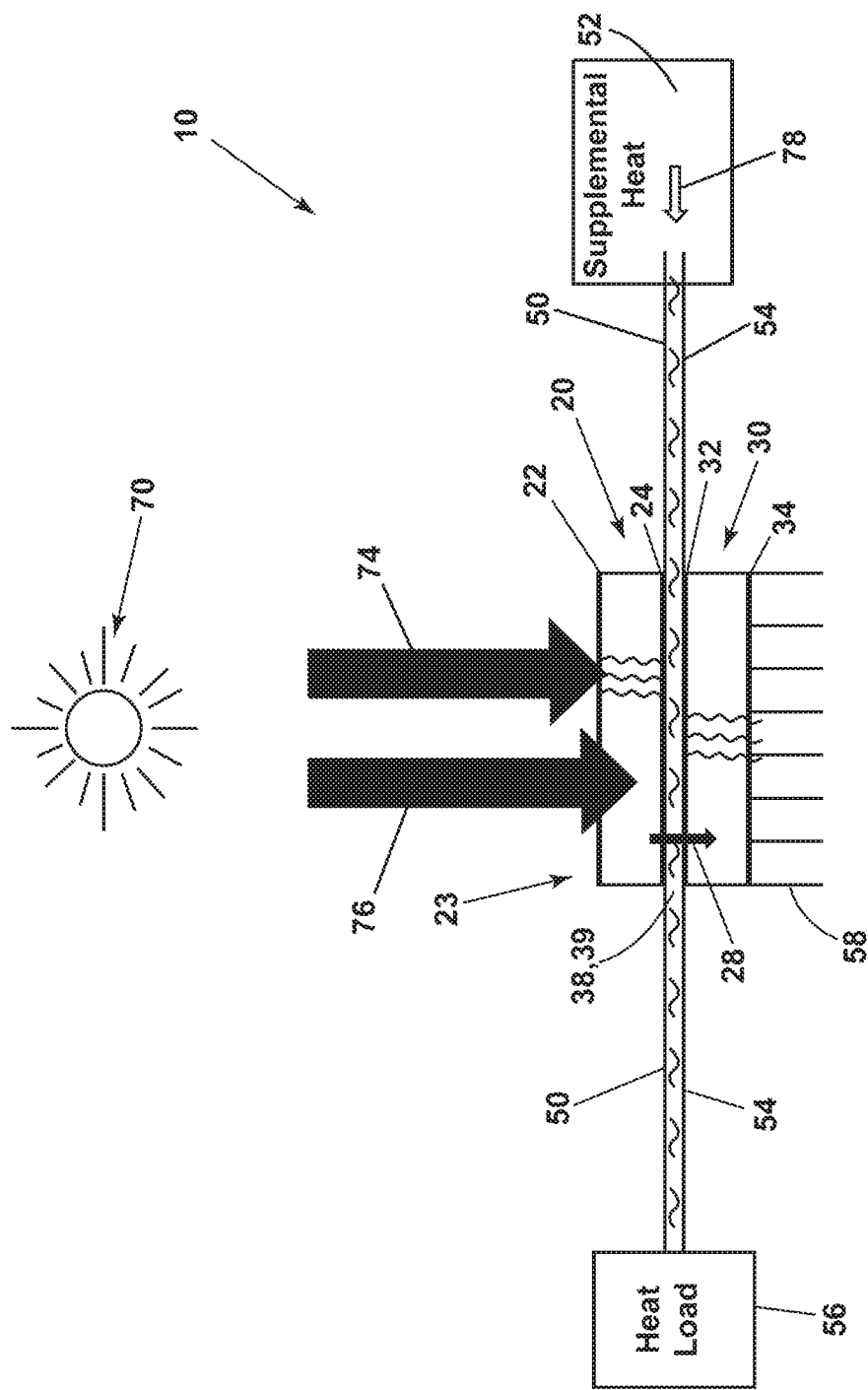
FIG. 2 illustrates a heat pipe exchanging heat with a hybrid solar generator at a thermal junction, in accordance with various aspects described herein.

FIG. 2, in various aspects of the present disclosure, illustrates a hybrid solar generator 10 which can include a heat pipe 54 thermally connected to the hot plate 32 for exchanging heat with hot plate 32. Heat pipe 54 can have a junction element 39 serving as thermal junction 38 between anode 24 and hot plate 32 and fluidly exchange heat with coupling anode 24 and hot plate 32, where junction element 39 can be a part of heat pipe 54. Heat pipe 54 can also be a solid for conducting heat between the thermal junction 38 and supplemental heat source 52 or heat load 56. For example, a supplemental heat 52 such as heated bleed air from a gas turbine engine (not shown) can be fluidly conducted to the thermal junction 38 through the heat pipe 54, and can thereby boost TEG current 36 by increasing the thermal gradient between hot plate 32 and cold plate 34. In other words, heated bleed air 52 can be combined with waste heat 28 from the anode to produce the second (TEG) current 36. Also, a heat load 56 can be a de-icing load connected to the heat pipe 54, wherein a portion of the heat from the bleed air conducted to thermal junction 38 is then conducted to the de-icing load 56. In addition, a portion of waste heat 28 can be conducted to heat load 56 through heat pipe 54.

De-icing load 56 can be a heating system distributing heat along the wings, fuselage, or other components of an airframe of an aircraft (not shown). Beneficially, coupling supplemental heat 52 and heat load 56 to thermal junction 38 can accomplish several improvements including an improved conversion efficiency for the solar generator 10 and an improved energy utilization among other systems consuming or generating energy on an aircraft. Heat pipe 54 can also be configured to be a solar collector 50 collecting solar radiation 70 through a flat surface having a high visible light absorptivity. Heat pipe 54 can be configured in a number of ways including, but not limited to, a metal or synthetic conduit, a vapor chamber device, a state change device, an evaporator, a condenser, or any other means known in the art and suitable for conducting heat between thermal junction 38 and a heat source or a heat load. Further implementations of de-icing and bleed air component are disclosed below.

Figure 3:
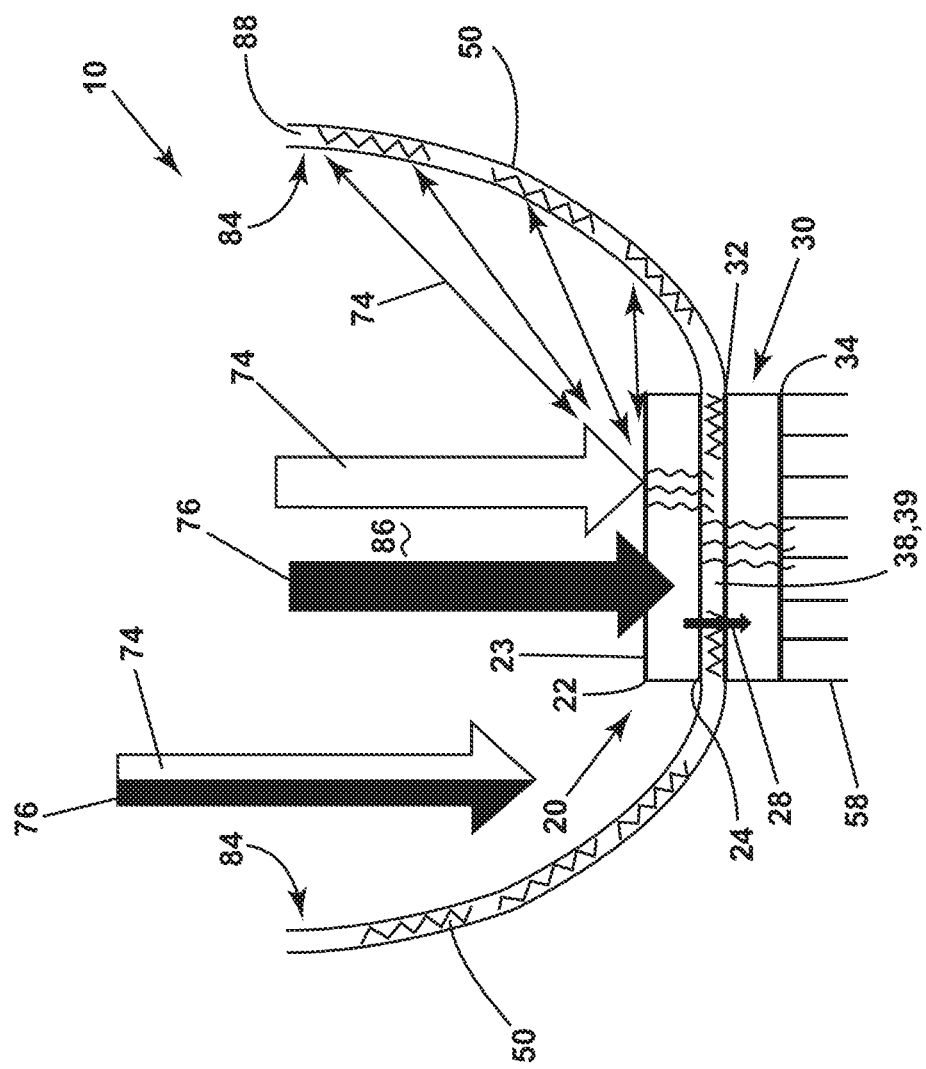
FIG. 3 illustrates a solar collector thermally coupled to a hybrid solar generator, in accordance with various aspects described herein.

Referring now to FIG. 3, in various aspects of the present disclosure, a hybrid solar generator 10 can include a solar collector 50 thermally connected to the hot plate 32 wherein solar radiation 70 adjacent to cathode 22 is collected by the solar collector 50 and transported to the hot plate 32 to junction element 39 serving as thermal junction 38, where junction element 39 can be a part of the solar collector 50. A surface area 84 can be configured to extend a collection area of solar radiation 70 beyond that of top surface 23 and the surface area 84 can have a focal point 86 for concentrating solar radiation on the PETE generator 20. A conductive portion 88 of collector 50 can lie below the surface area 84 and can conduct heat to the junction element 39 portion of solar collector 50 that lies between anode 24 and hot plate 32. Heat from solar collector 50 can combine with waste heat 28 for boosting TEG current 36. Surface area 84 can be adjacent to top surface 23 of cathode 22 and can collect visible light 76 and infrared light 74 and convert it into heat by employing a high absorptivity surface. Solar collector 50 can be shaped to recapture infrared light 74 radiating away from top surface 23 and redirect it back into thermal junction 38. Alternatively, solar collector 50 can be configured to reflect visible light 76 impinging surface area 84 to top surface 23.

In various aspects of the present disclosure, conductive portion 88 of the solar collector 50 can be a metal or a fluid pathway having high thermal conductivity. Surface area 84 can have a high absorptivity for maximally collecting incident short-wave radiation 76 and a low emissivity to limit re-radiation of long-wave energy 74. The collector 50 can be parabolic in shape to focus solar radiation 70 and can reflect a portion of the incident energy to a focal point 86 where the cathode 22 may be positioned. For example, the solar collector can be a metal parabolic element concentrating the solar radiation and conducting the resulting heat to the hot plate 32. Alternatively, the surface area can be a relatively flat surface such as the surface of a wing or fuselage. Solar collector 50 can be a composite panel (not shown) including an absorptive back panel, a low-emissivity surface area 84, and a conductive portion 88 comprising a water medium between the absorptive panel and the low-emissivity surface, much like the solar thermal panels used on rooftops.

In various aspects not shown, the solar collector 50 can utilize vapor chamber or state change technologies to conduct heat from the surface area 84 or from other collection points to the hot plate 32. Beneficially, combining an additional heat source like solar concentrator 50 can add a capability to achieve or regulate an efficient operating temperature for hybrid solar generator 10, thereby maximizing output current 16. For example, the conductive portion 88 comprising a conductive fluid can be regulated to by suitable means to vary an amount of heat delivered to thermal junction 38. In another aspect, a lens or lenses (not shown) positioned above top surface 23, such as a Fresnel lens, can focus and converge solar radiation onto top surface 23. The solar concentrator can establish a high operating temperature of between 200 and 1000 degrees Celsius for PETE 20.

Figure 4:
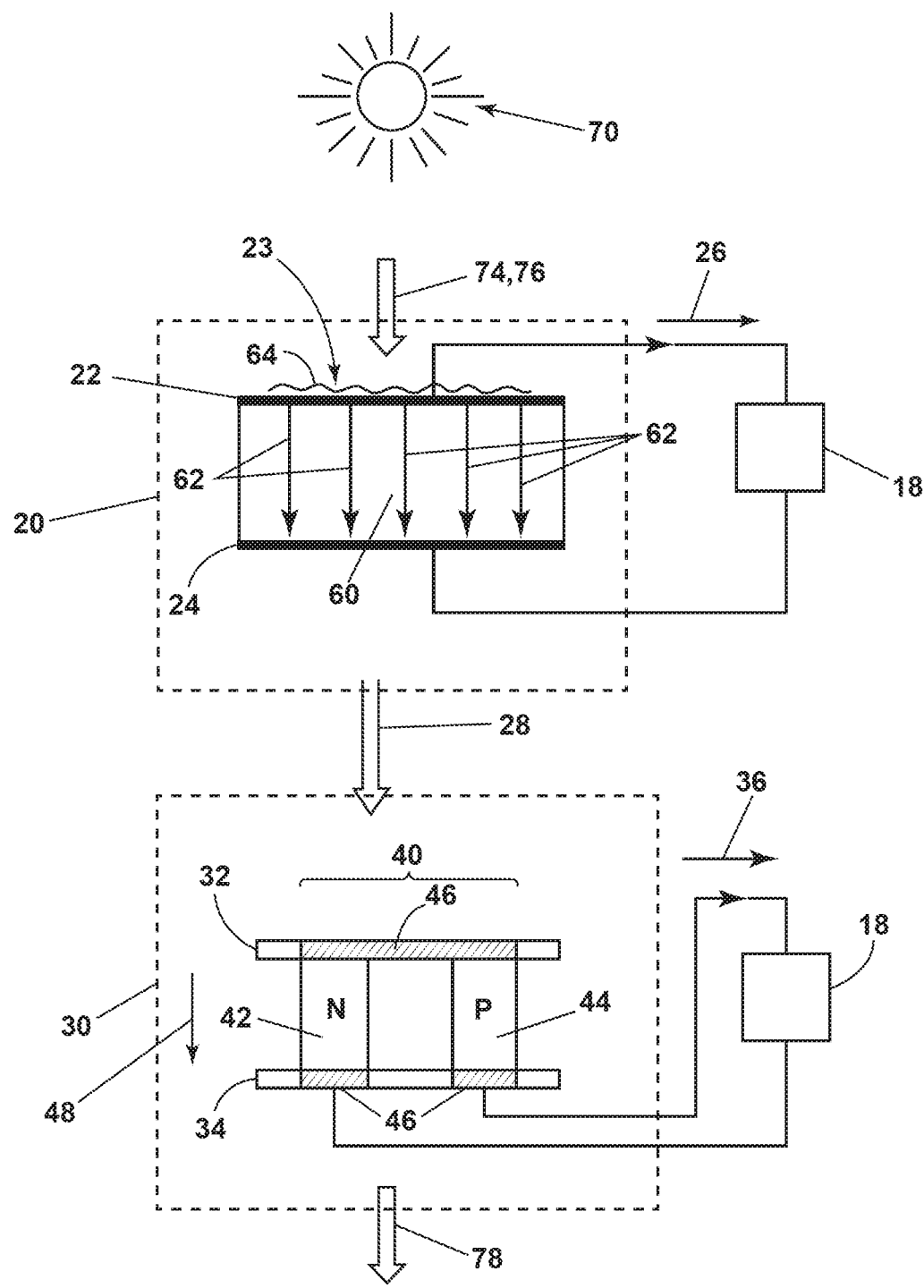
FIG. 4 illustrates a fabrication of a photon-enhanced thermionic emission generator directing and a thermoelectric generator, in accordance with various aspects described herein.

FIG. 4 illustrates various aspects of fabricating a PETE generator 20 and TEG 30 as introduced in FIG. 1. PETE generator 20 may include silicon carbide (SiC) nanowires 62 disposed in the gap 60 between cathode 22 and anode 24 of the PETE generator 20, where the SiC nanowires 62 electrically connect the cathode 22 to the anode 24, and where gap 60 is a vacuum gap. Alternatively, a SiC semiconductor layer or SiC nanowires can replace the vacuum of gap 60 in PETE generator 20. Beneficially, eliminating the need for a vacuum in gap 60 can offer much higher conversion efficiencies of PETE generator 20. SiC nanowires 62 can be of relatively small diameter for enhancing a photon scattering off of nanowire walls to greatly reduce thermal conductivity and minimize thermalization losses in PETE generator 20. Nanowires 62 can be sparsely spaced for optimizing charge carrier transport. Photo-excited electrons generated in the cathode 22 can emit into a conduction band of the nanowires 62 before collecting at the anode 24.

Alternatively, a semiconductor composition of PETE generator 20 may include, but is not limited to, gallium nitride or gallium arsenide. The percent composition of the SiC material can be varied in proportion to other semiconductor materials in order to tune the energy band levels, which can obviate the need for an ultra-low work function in anode 24. In one aspect of the present disclosure, a composition of the cathode 22 can include a photon-absorbing SiC material for optimizing an energy barrier of the cathode. For example, a top layer 64 of the cathode 22 can include a silicon carbide material and can face solar radiation 70 for absorbing visible light 76 and infrared light 74. The SiC top layer 64 can include SiC nanowires.

Continuing, FIG. 4 also illustrates a thermoelectric generator (TEG) 30 which can comprise a thermoelectric pair 40 of dissimilar semiconductors including a P-leg 44 and an N-leg 42 generating TEG current 36 from thermal gradient 48. An electrical terminal 46 can terminate each end of legs 44 and 42, where hot plate 32 can receive waste heat 28 on one side of legs 44 and 42 and cold plate 34 can sink heat flow 78 from the other side of legs 44 and 42. In general, TEG 30 can be constructed of many thermoelectric pairs 40 connected electrically in series and thermally in parallel. TEG 30 can be fabricated using silicon carbide (SiC) to afford a higher operating temperature or to establish compatibility with a SiC-based PETE generator 20 as described above.

Figure 5:
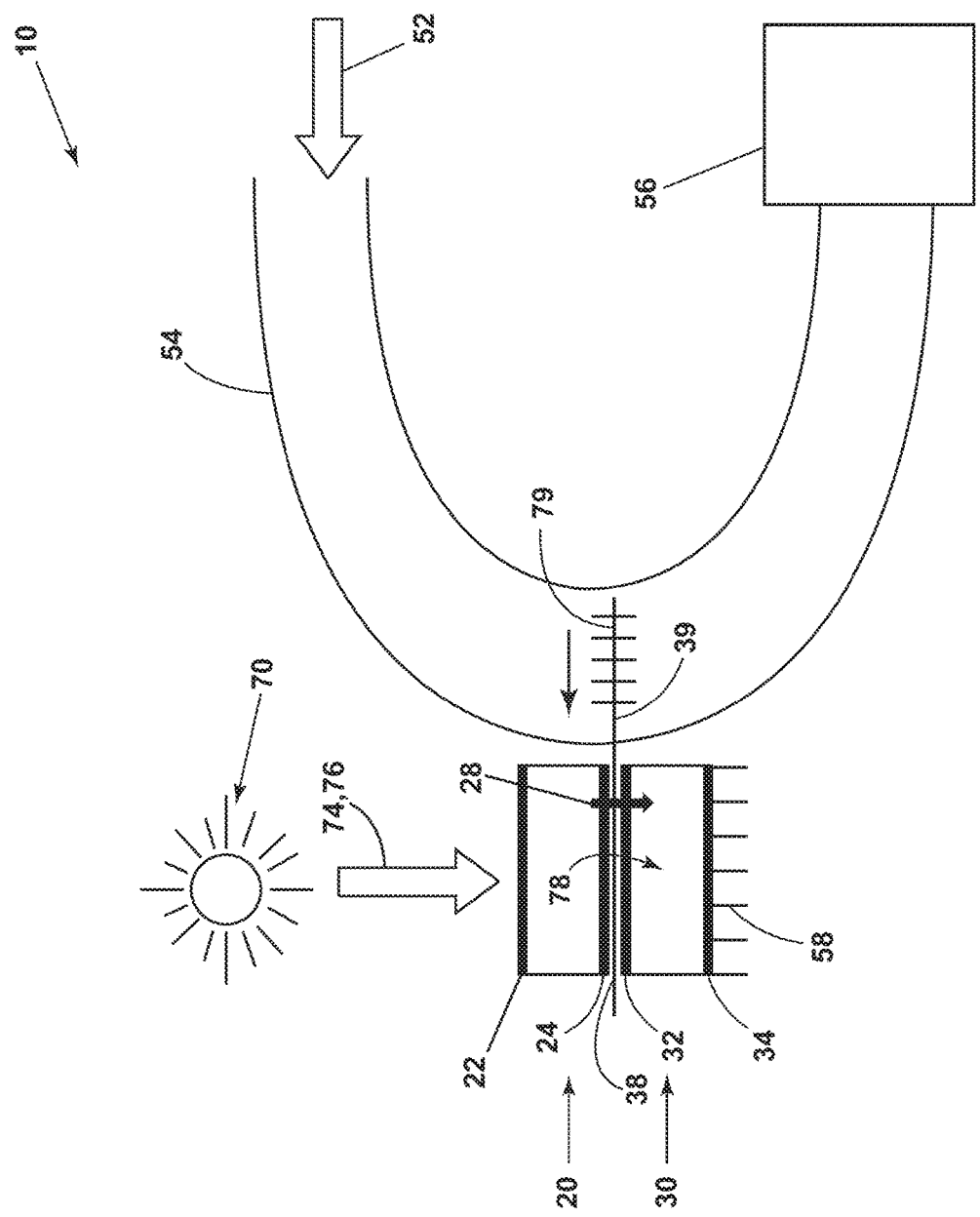
FIG. 5 illustrates a heat pipe exchanging heat with a thermal junction of a hybrid solar generator, in accordance with various aspects described herein.

FIG. 5 illustrates an aspect of the heat pipe described in FIG. 2 and which can include a heat exchanger 79 coupled with junction element 39 to receive a supplemental heat 52 or to exhaust a portion of waste heat 28 to heat load 56. Heat exchanger 79 can be a metal heat sink or can be an evaporator for absorbing heat from supplemental heat 52. Heat exchanger 79 can also be a condenser for discharging heat into heat pipe 54. Supplemental heat 52 can be heated bleed air of a gas turbine engine. Supplemental heat 52 can also be heated air from stages of a turbine engine other than a turbine compressor stage providing the heated bleed air. In addition, heated bleed air can be any heated air discharged and available from a fossil fuel engine.

Heat exchanger 79 can be regulated in terms of an adjustable conductivity (not shown) to direct more or less heat into or out of thermal junction 38, and which can depend from one or more of a desired operating temperature of thermal junction 38, a temperature of bleed air 52, an optimum temperature gradient for PETE generator 20, an amount of waste heat 28, or an amount of heat needed by heat load 56. For example, a state change fluid within an evaporator 79 can be regulated to allow more or less fluid to participate in heat exchanging within heat exchanger 79. Advantageously, combining PETE generator 20, TEG 30, and heat pipe 54 can create a synergy with other energy systems 52 and 56 aboard an aircraft for optimizing not only hybrid solar generator 10 but also optimizing all energy systems for best overall aircraft performance.

Heat load 56 can be a de-icing system utilizing waste heat 28 and bleed air 52 to heat surfaces such as wing surfaces to prevent the formation of ice, or to heat fuselage surfaces or other outer surfaces experiencing frictional drag for the aircraft in flight. Heat pipe 54 can be used to direct heat to outer surfaces having a turbulent boundary layer so as to reduce the frictional drag of those outer surfaces by virtue of their heating.

Figure 6:
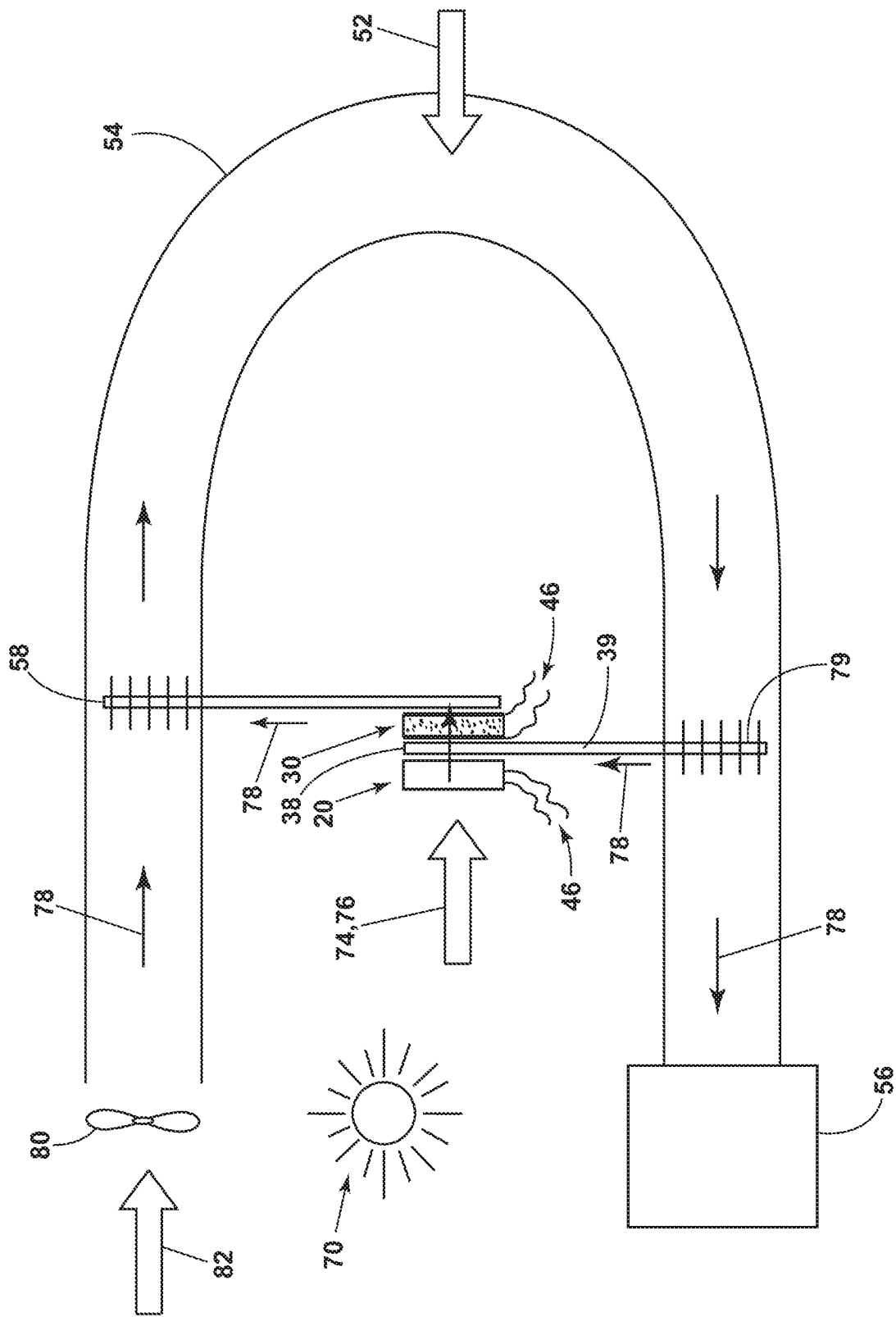
FIG. 6 illustrates a heat pipe exchanging heat with a thermal junction of a hybrid solar generator, in accordance with various aspects described herein.

FIG. 6 illustrates another aspect of the heat pipe described in FIG. 2 and which can include a heat exchanger 79 coupled with junction element 39 to receive a supplemental heat 52 or to exhaust a portion of waste heat 28 to heat load 56 through heat flow 78. Ambient sink 58 can be a heat sink or heat exchanger for cooling cold plate 34 (FIG. 5) using cold ambient air 82 driven by fan 80. Ambient sink 58 can be a condenser containing a state change gas which condenses when cold air 82 flows across sink 58. Heated air leaving sink 58 can then mix with a heated bleed air 52 to supply heat via evaporator 79 to TEG 30, or heated air leaving sink 58 can mix with the heated bleed air 52 to feed heat load 56 while heat exchanger 79 draws additional heat as waste heat 28 out of PETE generator 20. Alternatively, a plenum of heat pipe 54 can be split into a cooling channel for ambient sink 58 and a separate channel for heat exchanger 79 and a flow of supplemental heat 52.

Many other possible embodiments and configurations in addition to that shown in the above figures are contemplated by the present disclosure. To the extent not already described, the different features and structures of the various embodiments can be used in combination with each other as desired. That one feature cannot be illustrated in all of the embodiments is not meant to be construed that it cannot be, but is done for brevity of description. Thus, the various features of the different embodiments can be mixed and matched as desired to form new embodiments, whether or not the new embodiments are expressly described. Moreover, while "a set of" or "a plurality of" various elements have been described, it will be understood that "a set" or "a plurality" can include any number of the respective elements, including only one element. Combinations or permutations of features described herein are covered by this disclosure.

This written description uses examples to disclose embodiments of the disclosure, including the best mode, and also to enable any person skilled in the art to practice embodiments of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A solar generator comprising:
a photon-enhanced thermionic emission generator having a cathode configured to receive solar radiation and an anode that in conjunction with the cathode is configured to generate a first current and waste heat from solar radiation;
a thermoelectric generator thermally coupled to the anode, the thermoelectric generator configured to convert a first portion of heat receivable from waste heat and supplemental heat from a supplemental heat source into a second current;
an ambient sink thermally coupled with the thermoelectric generator and the supplemental heat source, the ambient sink configured to remove a second portion of the heat receivable from the waste heat and the supplemental heat, and configured to deliver the second portion of the heat to the supplemental heat source to be mixed with the supplemental heat;
a solar collector thermally connected to the thermoelectric generator, and wherein the supplemental heat is solar radiation collectable by the solar collector; and
a circuit connected to the photon-enhanced thermionic emission generator and to the thermoelectric generator to combine the first and second currents into an output current.

2. The solar generator of claim 1 wherein the thermoelectric generator includes a hot plate and a cold plate jointly defining a thermal gradient configured to generate the second current, the hot plate thermally coupling the waste heat from the anode.

3. The solar generator of claim 2 further comprising a heat pipe thermally connected to the hot plate for exchanging heat with the hot plate.

4. The solar generator of claim 3 wherein the heat pipe is configured to fluidly conduct the supplemental heat to the hot plate.

5. The solar generator of claim 3 further comprising a heat load thermally coupled to the hot plate through the heat pipe, the heat load configured to receive a portion of waste heat by way of the heat pipe.

6. The solar generator of claim 2 wherein the solar collector is thermally connected to the hot plate.

7. The solar generator of claim 6 wherein the solar collector has a surface area with a focal point near the cathode.

8. The solar generator of claim 1 further comprising a gap between the anode and the cathode wherein silicon carbide nanowires are disposed in the gap and electrically connect the cathode to the anode.

9. The solar generator of claim 1 further comprising a composition of the cathode including a photon-absorbing silicon carbide material for optimizing an energy barrier of the cathode.

10. The solar generator of claim 1 wherein the thermoelectric generator is fabricated using silicon carbide.

11. A hybrid solar generator comprising:
a photon-enhanced thermionic emission generator having a cathode configured to receive solar radiation and an anode that in conjunction with the cathode is configured to generate a first current and waste heat from solar radiation;
a thermoelectric generator thermally coupled with the anode and in communication with a source of heated bleed air, the thermoelectric generator configured to convert a first portion of the heat receivable from the waste heat and the heated bleed air into a second current;
an ambient sink thermally coupled with the thermoelectric generator and the heated bleed air, the ambient sink configured to remove a second portion of the heat receivable from the waste heat and the heated bleed air, and configured to reintroduce the second portion of the heat receivable to the heated bleed air to be mixed with the heated bleed air; and
a circuit connected to the photon-enhanced thermionic emission generator and to the thermoelectric generator to combine the first and second currents into an output current.

12. The hybrid solar generator of claim 11 wherein the thermoelectric generator includes a hot plate and a cold plate jointly defining a thermal gradient configured to generate the second current, the hot plate thermally coupling waste heat from the anode.

13. The hybrid solar generator of claim 12 further comprising a heat pipe thermally connected to the hot plate configured to conduct heat from the heated bleed air to the thermoelectric generator.

14. The hybrid solar generator of claim 13 further comprising a de-icing load thermally connected to the heat pipe, wherein a portion of the heat from the heated bleed air is conductable to the de-icing load.

15. The hybrid solar generator of claim 11 wherein the photon-enhanced thermionic emission generator includes at least one of silicon carbide nanowires connecting the cathode and the anode or the cathode including photon-absorbing silicon carbide material optimizing an energy barrier of the cathode.

16. A method of converting solar radiation to electricity comprising:
providing a photon-enhanced thermionic emission generator having a cathode to receive the solar radiation and an anode that in conjunction with the cathode generates a first current and waste heat from the solar radiation;
exposing the cathode to the solar radiation by way of a solar collector;
providing a supplemental heat source in the form of heated bleed air from a gas turbine engine;
disposing a thermoelectric generator adjacent the anode to convert a first portion of heat received from the waste heat and a supplemental heat from the supplemental heat source into a second current;

dissipating a second portion of heat received from the waste heat and the supplemental heat from the thermoelectric generator to a heat flow, and mixing the heat flow with the supplemental heat upstream of the thermoelectric generator; and combining the first current and the second current into an output current.

17. The method of claim 16 further comprising directing a portion of the waste heat from the anode to a de-icing load.

18. The method of claim 16 further comprising collecting solar radiation adjacent the cathode and thermally coupling the collected solar radiation to the thermoelectric generator for generating the output current.

19. The method of claim 16 further comprising including silicon carbide in a composition of at least one of the photon-enhanced thermionic emission generator or the thermoelectric generator.

\* \* \* \* \*